(12) United States Patent
Dvorak et al.

(10) Patent No.: US 7,253,637 B2
(45) Date of Patent: Aug. 7, 2007

(54) ARC FAULT CIRCUIT INTERRUPTER SYSTEM

(75) Inventors: Robert F. Dvorak, Mt. Vernon, IA (US); Kon B. Wong, Cedar Rapids, IA (US)

(73) Assignee: Square D Company, Palatine, IL (US)

( * ) Notice: Subject to any disclaimer, the term of this patent is extended or adjusted under 35 U.S.C. 154(b) by 0 days.

(21) Appl. No.: 11/225,293

(22) Filed: Sep. 13, 2005

(65) Prior Publication Data

US 2007/0057678 A1    Mar. 15, 2007

(51) Int. Cl.
*G01R 31/08* (2006.01)
*G01R 31/12* (2006.01)
*H01H 9/50* (2006.01)

(52) U.S. Cl. ..................................... 324/536
(58) Field of Classification Search ................. 324/536
See application file for complete search history.

(56) References Cited

U.S. PATENT DOCUMENTS

| | | | |
|---|---|---|---|
| 2,808,566 A | 10/1957 | Douma | 324/127 |
| 2,832,642 A | 4/1958 | Lennox | 299/132 |
| 2,898,420 A | 8/1959 | Kuze | 200/87 |
| 3,471,784 A | 10/1969 | Arndt et al. | 324/126 |
| 3,538,241 A | 11/1970 | Rein | 174/143 |
| 3,588,611 A | 6/1971 | Lambden et al. | 317/31 |
| 3,600,502 A | 8/1971 | Wagenaar et al. | 174/143 |
| 3,622,872 A | 11/1971 | Boaz et al. | 324/52 |
| 3,660,721 A | 5/1972 | Baird | 361/55 |
| 3,684,955 A | 8/1972 | Adams | 324/72 |
| 3,716,757 A | 2/1973 | Rodriquez | 317/40 |
| 3,746,930 A | 7/1973 | Van Best et al. | 317/31 |
| 3,775,675 A | 11/1973 | Freeze et al. | 324/51 |
| 3,812,337 A | 5/1974 | Crosley | 235/153 AC |
| 3,858,130 A | 12/1974 | Misencik | 335/18 |
| 3,869,665 A | 3/1975 | Kenmochi et al. | 324/72 |
| 3,878,460 A | 4/1975 | Nimmersjo | 324/52 |
| 3,911,323 A | 10/1975 | Wilson et al. | 317/18 |
| 3,914,667 A | 10/1975 | Waldron | 317/36 |

(Continued)

FOREIGN PATENT DOCUMENTS

CA    2256208    6/1999

(Continued)

OTHER PUBLICATIONS

Antonio N. Paolantonio, P.E., Directional Couplers, R.F. Design, Sep./Oct. 1979, pp. 40-49.

(Continued)

*Primary Examiner*—Walter Benson
*Assistant Examiner*—Timothy J. Dole
(74) *Attorney, Agent, or Firm*—Nixon Peabody LLP

(57) ABSTRACT

In order to determine whether arcing is present in an electrical circuit, a sensor signal corresponding to current in said electrical circuit is processed. The sensor signal is filtered to determine the presence of noise in a predetermined frequency range and produce a corresponding filtered signal. The corresponding filtered signal is compared to a reference threshold voltage to generate an output signal potentially indicative of arcing. A selection is made of one from a plurality of available threshold voltages as the reference threshold voltage for use in the comparing operation. The detection operation supports either or both branch feeder arc fault detection and/or series arc fault detection.

34 Claims, 6 Drawing Sheets

U.S. PATENT DOCUMENTS

| | | | |
|---|---|---|---|
| 3,932,790 A | 1/1976 | Muchnick | 317/18 D |
| 3,939,410 A | 2/1976 | Bitsch et al. | 324/72 |
| 4,052,751 A | 10/1977 | Shepard | 361/50 |
| 4,074,193 A | 2/1978 | Kohler | 324/126 |
| 4,081,852 A | 3/1978 | Coley et al. | 361/45 |
| 4,087,744 A | 5/1978 | Olsen | 324/51 |
| 4,115,828 A | 9/1978 | Rowe et al. | 361/1 |
| 4,156,846 A | 5/1979 | Harrold et al. | 324/158 |
| 4,166,260 A | 8/1979 | Gillette | 335/20 |
| 4,169,260 A | 9/1979 | Bayer | 340/562 |
| 4,214,210 A | 7/1980 | O'Shea | 455/282 |
| 4,233,640 A | 11/1980 | Klein et al. | 361/44 |
| 4,245,187 A | 1/1981 | Wagner et al. | 324/54 |
| 4,251,846 A | 2/1981 | Pearson et al. | 361/30 |
| 4,264,856 A | 4/1981 | Frierdich et al. | 322/25 |
| RE30,678 E | 7/1981 | Van Zeeland et al. | 361/44 |
| 4,316,187 A | 2/1982 | Spencer | 340/664 |
| 4,344,100 A | 8/1982 | Davidson et al. | 361/45 |
| 4,354,154 A | 10/1982 | Olsen | 324/51 |
| 4,356,443 A | 10/1982 | Emery | 324/51 |
| 4,358,809 A | 11/1982 | Blok | 361/46 |
| 4,378,525 A | 3/1983 | Burdick | 324/127 |
| 4,387,336 A | 6/1983 | Joy et al. | 324/51 |
| 4,459,576 A | 7/1984 | Fox et al. | 336/84 |
| 4,466,071 A | 8/1984 | Russell, Jr. | 364/492 |
| 4,477,855 A | 10/1984 | Nakayama et al. | 361/54 |
| 4,559,491 A | 12/1985 | Saha | 324/52 |
| 4,587,588 A | 5/1986 | Goldstein | 361/54 |
| 4,589,052 A | 5/1986 | Dougherty | 361/94 |
| 4,590,355 A | 5/1986 | Nomura et al. | 219/125.12 |
| 4,616,200 A | 10/1986 | Fixemer et al. | 335/35 |
| 4,639,817 A | 1/1987 | Cooper et al. | 361/62 |
| 4,642,733 A | 2/1987 | Schacht | 361/363 |
| 4,644,439 A | 2/1987 | Taarning | 361/87 |
| 4,652,867 A | 3/1987 | Masot | 340/638 |
| 4,658,322 A | 4/1987 | Rivera | 361/37 |
| 4,697,218 A | 9/1987 | Nicolas | 633/882 |
| 4,702,002 A | 10/1987 | Morris et al. | 29/837 |
| 4,707,759 A | 11/1987 | Bodkin | 831/642 |
| 4,771,355 A | 9/1988 | Emery et al. | 361/33 |
| H536 H | 10/1988 | Strickland et al. | 324/456 |
| H538 H | 11/1988 | Betzold | 89/134 |
| 4,792,889 A | 12/1988 | Krägelin et al. | 364/191 |
| 4,810,954 A | 3/1989 | Fam | 324/142 |
| 4,816,958 A | 3/1989 | Belbel et al. | 361/93 |
| 4,833,564 A | 5/1989 | Pardue et al. | 361/93 |
| 4,835,648 A | 5/1989 | Yamauchi | 361/14 |
| 4,839,600 A | 6/1989 | Kuurstra | 324/127 |
| 4,845,580 A | 7/1989 | Kitchens | 361/91 |
| 4,847,719 A | 7/1989 | Cook et al. | 361/13 |
| 4,853,818 A | 8/1989 | Emery et al. | 361/33 |
| 4,858,054 A | 8/1989 | Franklin | 361/57 |
| 4,866,560 A | 9/1989 | Allina | 361/104 |
| 4,882,682 A | 11/1989 | Takasuka et al. | 364/507 |
| 4,893,102 A | 1/1990 | Bauer | 335/132 |
| 4,901,183 A | 2/1990 | Lee | 361/56 |
| 4,922,368 A | 5/1990 | Johns | 361/62 |
| 4,922,492 A | 5/1990 | Fasang et al. | 371/22.1 |
| 4,931,894 A | 6/1990 | Legatti | 361/45 |
| 4,939,495 A | 7/1990 | Peterson et al. | 337/79 |
| 4,949,214 A | 8/1990 | Spencer | 361/95 |
| 4,969,063 A | 11/1990 | Scott et al. | 361/93 |
| 5,010,438 A | 4/1991 | Brady | 361/56 |
| 5,012,673 A | 5/1991 | Takano et al. | 73/118.1 |
| 5,032,744 A | 7/1991 | Wai Yeung Liu | 307/491 |
| 5,047,724 A | 9/1991 | Boksiner et al. | 324/520 |
| 5,051,731 A | 9/1991 | Guim et al. | 340/638 |
| 5,063,516 A | 11/1991 | Jamoua et al. | 364/431.11 |
| 5,107,208 A | 4/1992 | Lee | 324/158 R |
| 5,117,325 A | 5/1992 | Dunk et al. | 361/93 |
| 5,121,282 A | 6/1992 | White | 361/42 |
| 5,166,861 A | 11/1992 | Krom | 361/379 |
| 5,168,261 A | 12/1992 | Weeks | 340/515 |
| 5,179,491 A | 1/1993 | Runyan | 361/45 |
| 5,185,684 A | 2/1993 | Beihoff et al. | 361/45 |
| 5,185,685 A | 2/1993 | Tennies et al. | 361/45 |
| 5,185,686 A | 2/1993 | Hansen et al. | 361/45 |
| 5,185,687 A | 2/1993 | Beihoff et al. | 361/45 |
| 5,206,596 A | 4/1993 | Beihoff et al. | 324/536 |
| 5,208,542 A | 5/1993 | Tennies et al. | 324/544 |
| 5,223,795 A | 6/1993 | Blades | 324/536 |
| 5,224,006 A | 6/1993 | MacKenzie et al. | 361/45 |
| 5,233,511 A | 8/1993 | Bilas et al. | 364/146 |
| 5,257,157 A | 10/1993 | Epstein | 361/111 |
| 5,280,404 A | 1/1994 | Ragsdale | 361/113 |
| 5,283,708 A | 2/1994 | Waltz | 361/93 |
| 5,286,933 A | 2/1994 | Pham | 200/144 |
| 5,307,230 A | 4/1994 | MacKenzie | 361/96 |
| 5,334,939 A | 8/1994 | Yarbrough | 324/424 |
| 5,341,265 A | 8/1994 | Westrom et al. | |
| 5,353,014 A | 10/1994 | Carroll et al. | 340/638 |
| 5,359,293 A | 10/1994 | Boksiner et al. | 324/544 |
| 5,363,269 A | 11/1994 | McDonald | 361/45 |
| 5,373,241 A | 12/1994 | Ham, Jr. et al. | 324/536 |
| 5,383,084 A | 1/1995 | Gershen et al. | 361/113 |
| 5,388,021 A | 2/1995 | Stahl | 361/56 |
| 5,396,179 A | 3/1995 | Domenichini et al. | 324/546 |
| 5,412,526 A | 5/1995 | Kapp et al. | 361/56 |
| 5,414,590 A | 5/1995 | Tajali | 361/669 |
| 5,420,740 A | 5/1995 | MacKenzie et al. | 361/45 |
| 5,424,894 A | 6/1995 | Briscall et al. | 361/45 |
| 5,432,455 A | 7/1995 | Blades | 324/536 |
| 5,434,509 A | 7/1995 | Blades | 324/536 |
| 5,444,424 A | 8/1995 | Wong et al. | 335/172 |
| 5,446,431 A | 8/1995 | Leach et al. | 335/18 |
| 5,448,443 A | 9/1995 | Muelleman | 361/111 |
| 5,452,223 A | 9/1995 | Zuercher et al. | 364/483 |
| 5,459,630 A | 10/1995 | MacKenzie et al. | 361/45 |
| 5,473,494 A | 12/1995 | Kurosawa et al. | 361/3 |
| 5,477,150 A | 12/1995 | Ham, Jr. et al. | 324/536 |
| 5,481,235 A | 1/1996 | Heise et al. | 335/18 |
| 5,483,211 A | 1/1996 | Carrodus et al. | 335/18 |
| 5,485,093 A | 1/1996 | Russell et al. | 324/522 |
| 5,493,278 A | 2/1996 | MacKenzie et al. | 340/638 |
| 5,506,789 A | 4/1996 | Russell et al. | 364/492 |
| 5,510,946 A | 4/1996 | Franklin | 361/56 |
| 5,512,832 A | 4/1996 | Russell et al. | 324/522 |
| 5,519,561 A | 5/1996 | Mrenna et al. | 361/105 |
| 5,531,617 A | 7/1996 | Marks | 439/723 |
| 5,546,266 A | 8/1996 | Mackenzie et al. | 361/93 |
| 5,561,605 A | 10/1996 | Zuercher et al. | 364/483 |
| 5,568,371 A | 10/1996 | Pitel et al. | 363/39 |
| 5,578,931 A | 11/1996 | Russell et al. | 324/536 |
| 5,590,010 A | 12/1996 | Ceola et al. | 361/93 |
| 5,590,012 A | 12/1996 | Dollar | 361/113 |
| 5,602,709 A | 2/1997 | Al-Dabbagh | 361/85 |
| 5,608,328 A | 3/1997 | Sanderson | 324/529 |
| 5,617,019 A | 4/1997 | Etter | 324/117 |
| 5,638,244 A | 6/1997 | Mekanik et al. | 361/62 |
| 5,657,244 A | 8/1997 | Seitz | 364/492 |
| 5,659,453 A | 8/1997 | Russell et al. | 361/93 |
| 5,682,101 A | 10/1997 | Brooks et al. | 324/536 |
| 5,691,869 A | 11/1997 | Engel et al. | 361/42 |
| 5,701,110 A | 12/1997 | Scheel et al. | 335/132 |
| 5,706,154 A | 1/1998 | Seymour | 361/42 |
| 5,706,159 A | 1/1998 | Dollar, II et al. | 361/113 |
| 5,726,577 A | 3/1998 | Engel et al. | 324/536 |
| 5,729,145 A | 3/1998 | Blades | 324/536 |
| 5,754,386 A | 5/1998 | Barbour et al. | 361/154 |
| 5,764,125 A | 6/1998 | May | 336/92 |
| 5,774,555 A | 6/1998 | Lee et al. | 381/4 |
| 5,784,020 A | 7/1998 | Inoue | 341/141 |
| 5,805,397 A | 9/1998 | MacKenzie | 361/42 |
| 5,805,398 A | 9/1998 | Rae | 361/42 |

| | | | |
|---|---|---|---|
| 5,815,352 A | 9/1998 | Mackenzie | 361/42 |
| 5,818,237 A | 10/1998 | Zuercher et al. | 324/536 |
| 5,818,671 A | 10/1998 | Seymour et al. | 361/42 |
| 5,825,598 A | 10/1998 | Dickens et al. | 361/42 |
| 5,834,940 A | 11/1998 | Brooks et al. | 324/424 |
| 5,835,319 A | 11/1998 | Welles, II et al. | 361/5 |
| 5,835,321 A | 11/1998 | Elms et al. | 361/45 |
| 5,839,092 A | 11/1998 | Erger et al. | 702/58 |
| 5,847,913 A | 12/1998 | Turner et al. | 361/42 |
| 5,886,860 A | 3/1999 | Chen et al. | 361/9 |
| 5,886,861 A | 3/1999 | Parry | 361/42 |
| 5,889,643 A | 3/1999 | Elms | 361/42 |
| 5,896,262 A | 4/1999 | Rae et al. | 361/94 |
| 5,905,619 A | 5/1999 | Jha | 361/93 |
| 5,933,305 A | 8/1999 | Schmalz et al. | 361/42 |
| 5,933,308 A | 8/1999 | Garzon | 361/62 |
| 5,933,311 A | 8/1999 | Chen et al. | 361/106 |
| 5,946,179 A | 8/1999 | Fleege et al. | 361/93 |
| 5,963,406 A | 10/1999 | Neiger et al. | 361/42 |
| 5,999,384 A | 12/1999 | Chen et al. | 361/42 |
| 6,002,561 A | 12/1999 | Dougherty | 361/42 |
| 6,011,680 A | 1/2000 | Solleder et al. | 361/90 |
| 6,031,699 A | 2/2000 | Dollar, II et al. | 361/42 |
| 6,054,887 A | 4/2000 | Horie et al. | 327/307 |
| 6,088,205 A | 7/2000 | Neiger et al. | 361/42 |
| 6,097,884 A | 8/2000 | Sugasawara | 395/500.05 |
| 6,128,169 A | 10/2000 | Neiger et al. | |
| 6,185,732 B1 | 2/2001 | Mann et al. | 717/128 |
| 6,242,922 B1 | 6/2001 | Daum et al. | 324/520 |
| 6,246,556 B1 | 6/2001 | Haun et al. | 361/42 |
| 6,259,996 B1 | 7/2001 | Haun et al. | 702/58 |
| 6,339,525 B1 | 1/2002 | Neiger et al. | 361/42 |
| 6,377,427 B1 | 4/2002 | Haun et al. | 361/42 |
| 6,414,829 B1 | 7/2002 | Haun et al. | 361/42 |
| 6,456,471 B1 | 9/2002 | Haun et al. | 361/42 |
| 6,477,021 B1 | 11/2002 | Haun et al. | 361/42 |
| 6,504,692 B1 | 1/2003 | Macbeth et al. | |
| 6,525,918 B1 | 2/2003 | Alles et al. | 361/93.1 |
| 6,532,424 B1 | 3/2003 | Haun et al. | 702/58 |
| 6,567,250 B1 | 5/2003 | Haun et al. | 361/42 |
| 6,570,392 B2 | 5/2003 | Macbeth et al. | 324/536 |
| 6,577,138 B2 | 6/2003 | Zuercher et al. | 324/536 |
| 6,590,754 B1 | 7/2003 | Macbeth | 361/42 |
| 6,621,669 B1 | 9/2003 | Haun et al. | 361/42 |
| 6,625,550 B1 | 9/2003 | Scott et al. | 702/58 |
| 6,736,944 B2 * | 5/2004 | Buda | 204/192.13 |
| 6,798,628 B1 | 9/2004 | Macbeth | 361/42 |
| 6,839,208 B2 | 1/2005 | Macbeth et al. | 361/42 |
| 2003/0072113 A1 | 4/2003 | Wong et al. | 361/5 |
| 2004/0042137 A1* | 3/2004 | Wong et al. | 361/42 |

FOREIGN PATENT DOCUMENTS

| | | |
|---|---|---|
| CA | 2256243 | 6/1999 |
| DE | 105100 | 6/1924 |
| DE | 19515067 | 2/1997 |
| DE | 19601884 A1 | 7/1997 |
| DE | 19633527 | 2/1998 |
| EP | 0094871 A1 | 5/1983 |
| EP | 0615327 A2 | 9/1994 |
| EP | 0649207 A1 | 4/1995 |
| EP | 0712193 | 5/1996 |
| EP | 0748021 B1 | 12/1996 |
| EP | 0762591 A2 | 3/1997 |
| EP | 0762591 A3 | 3/1997 |
| EP | 0762591 B1 | 3/1997 |
| EP | 0802602 A2 | 10/1997 |
| EP | 0802602 A3 | 10/1997 |
| EP | 0813281 A2 | 12/1997 |
| EP | 0813281 A3 | 12/1997 |
| EP | 0981193 A2 | 2/2000 |
| EP | 1005129 A2 | 5/2000 |
| GB | 227930 | 1/1925 |
| GB | 865775 | 4/1961 |
| GB | 2177561 A | 6/1985 |
| GB | 2241396 A | 8/1991 |
| GB | 2285886 A | 7/1995 |
| JP | 58 180960 | 10/1983 |
| JP | 0158365 | 6/1989 |
| WO | WO 97/30501 | 8/1997 |
| WO | WO 99/43065 | 8/1999 |
| WO | WO 03/105303 A1 | 12/2003 |

OTHER PUBLICATIONS

Alejandro Duenas, J., Directional Coupler Design Graphs For Parallel Coupled Lines and Interdigitated 3 dB Couplers, RF Design, Feb. 1986, pp. 62-64.

RV4145 Low Power Ground Fault Interrupter, Preliminary Product Specifications of Integrated Circuits, Raytheon Company Semiconductor Division, 350 Ellis Street, Mountain View CA 94309-7016, pp. 1-8, no date.

Jean-Francois Joubert, Feasibility of Main Service Ground-Fault Protection On The Electrical Service To Dwelling Units, Consultants Electro-Protection Ins., 1980, Michelin St., Laval, Quebec H7L 9Z7. Oct. 26, 1990, pp. 1-77.

B.D. Russell, Detection Of Arcing Faults On Distribution Feeders, Texas A & M Research Foundation, Box H. College Station, Texas 77843, Final Report Dec. 1982, pp. 1-B18.

Preliminary Search Report dated Jul. 16, 2004 for French application No. 01/16901.

Preliminary Search Report dated Jul. 15, 2004 for French application No. 00/16481.

Preliminary Search Report dated Jul. 15, 2004 for French application No. 00/16479.

Preliminary Search Report dated Jul. 15, 2004 for French application No. 00/04956.

International Search Report dated Oct. 29, 2004 for French application No. PCT/US2004/014829.

Supplementary European Search Report dated Jan. 14, 2005 for application No. EP 99 93 5468.

Supplementary European Search Report dated Feb. 25, 2005 for application No. EP 99 90 5523.

International Search Report dated Feb. 3, 2007 for Application No. PCT/US2006/034394.

* cited by examiner

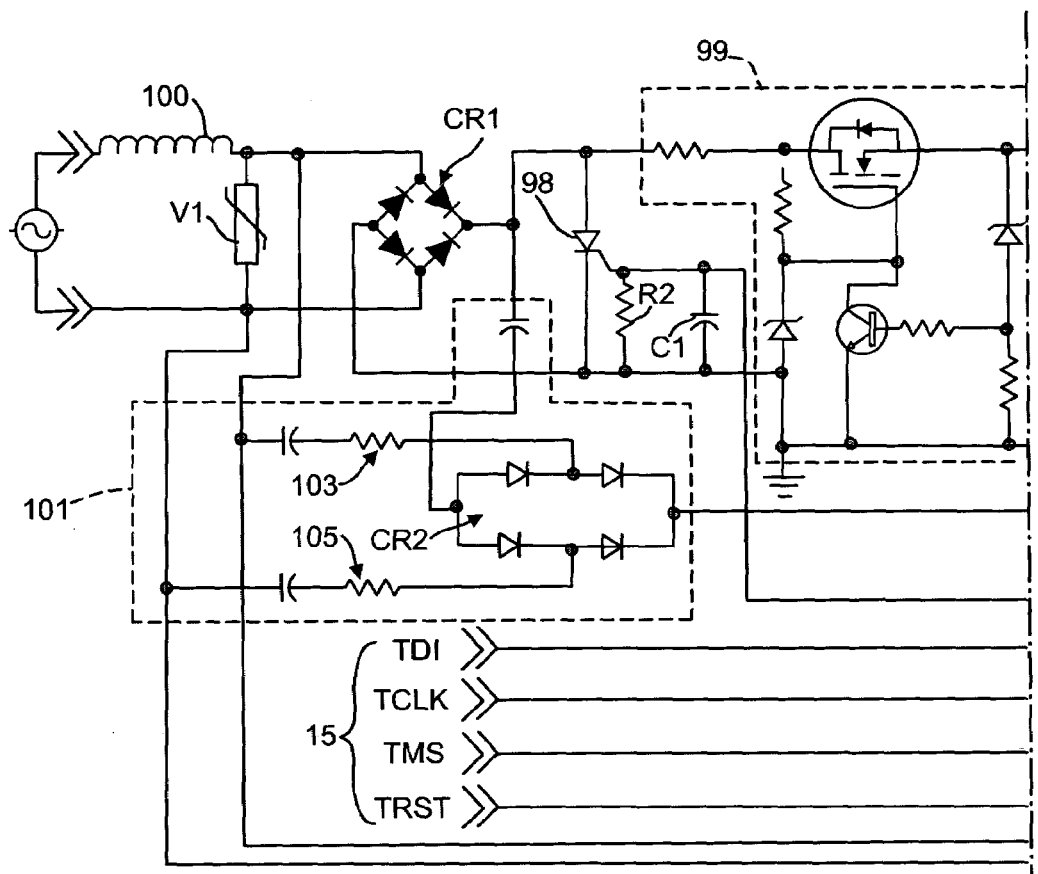
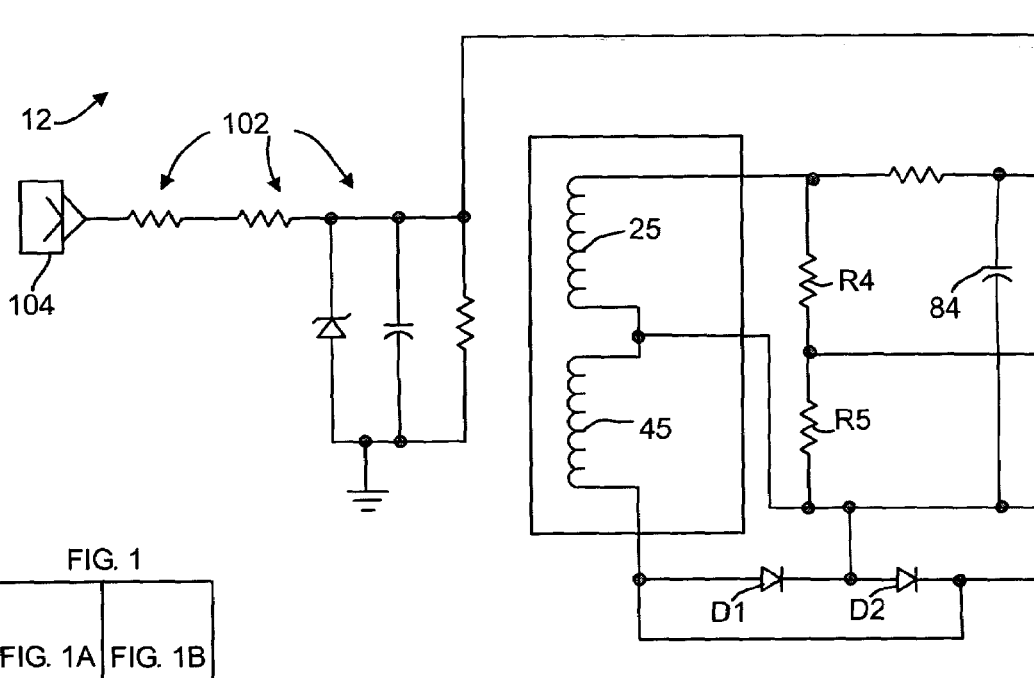
FIG. 1
| FIG. 1A | FIG. 1B |
FIG. 1A

ARC FAULT CIRCUIT INTERRUPTER SYSTEM

FIELD OF THE INVENTION

The present invention relates to the protection of electrical circuits and, more particularly, to the detection of electrical faults of the type known as arcing faults in an electrical circuit.

BACKGROUND OF THE INVENTION

The electrical systems in residential, commercial and industrial applications usually include a panelboard for receiving electrical power from a utility source. The power is then routed through protection devices to designated branch circuits supplying one or more loads. These overcurrent devices are typically circuit interrupters such as circuit breakers and fuses which are designed to interrupt the electrical current if the limits of the conductors supplying the loads are surpassed.

Circuit breakers are a preferred type of circuit interrupter because a resetting mechanism allows for their reuse. Typically, circuit breakers interrupt an electric circuit due to a disconnect or trip condition such as a current overload or ground fault. The current overload condition results when a current exceeds the continuous rating of the breaker for a time interval determined by the current. A ground fault trip condition is created by an imbalance of currents flowing between a line conductor and a neutral conductor which could be caused by a leakage current or an arcing fault to ground.

Arcing faults are commonly defined as current through ionized gas between two ends of a broken conductor or at a faulty contact or connector, between two conductors supplying a load, or between a conductor and ground. However, arcing faults may not cause a conventional circuit breaker to trip. Arcing fault current levels may be reduced by branch or load impedance to a level below the trip curve settings of the circuit breaker. In addition, an arcing fault which does not contact a grounded conductor or person will not trip a ground fault protector.

There are many conditions that may cause an arcing fault. For example, corroded, worn or aged wiring, connectors, contacts or insulation, loose connections, wiring damaged by nails or staples through the insulation, and electrical stress caused by repeated overloading, lightning strikes, etc. These faults may damage the conductor insulation and/or cause the conductor to reach an unacceptable temperature.

National Electrical code requirements presently allow arc fault circuit interrupters (AFCI's) for outlets supplying bedroom branch circuits in all dwelling units to be of the "branch feeder" type. The branch feeder is capable of detecting parallel arc faults (i.e., arcing across the line) at or above 75 amperes. These devices are primarily designed to protect the branch wiring from the circuit breaker panel to the outlet and to some degree devices plugged into those outlets. Effective Jan. 1, 2008, the National Electrical code will require "combination" type AFCI's providing a higher degree of protection for outlets supplying bedroom branch circuits. Combination AFCI's are capable of providing all the protection afforded by a branch feeder AFCI, but are further capable of detecting series arc faults (i.e., an arc in series with either line conductor) as low as 5 amperes. Such a fault could occur, for example, in a lamp or appliance cord for a device plugged into an outlet.

It is known in the art of branch feeder arc fault detection to measure high frequency spectral components in the load current signature of an arcing load. If sufficient spectral content is present in certain frequency bands, this can be taken into account and used to detect the arc fault using a signal processing detection algorithm. One of the challenges in detecting series arc faults at the relatively lower amperage detection level standard specified for a combination type AFCI is correctly measuring the amplitude of high frequency components because these high frequency components are reduced, in comparison to branch feeder arc faults, at the low arcing current levels of a series arc fault. This challenge is exacerbated by the fact that inductive loads, such as an electric motor, may be present in series with the arc, and these loads tend to attenuate the amplitude of the high frequency signature. An additional problem is presented by the presence of personal computers and other electronic equipment which provide capacitive filtering of the power line. These filters effectively short out part of the high frequency signal when connected to the same circuit as the arc which needs to be detected.

Embodiments of the present invention address a need in the art for a combination type AFCI. More specifically, embodiments of the present invention address a need in the art for detecting the presence of high frequency current components at low level amperage series arcing currents.

SUMMARY OF THE INVENTION

In accordance with an embodiment of the invention, a circuit is presented for determining whether arcing is present in an electrical circuit in response to a sensor signal corresponding to current in said electrical circuit. The circuit comprises a filter circuit for analyzing said sensor signal to determine the presence of noise in a predetermined frequency range, and producing a corresponding filtered signal. A comparator circuit compares the corresponding filtered signal to a reference threshold voltage to generate an output signal. A switching circuit receives a plurality of threshold voltages and operates to select one of those threshold voltages as the reference threshold voltage for application to the comparator circuit.

In accordance with another embodiment, a method is presented for determining whether arcing is present in an electrical circuit in response to a sensor signal corresponding to current in said electrical circuit. The sensor signal is filtered to determine the presence of noise in a predetermined frequency range and produce a corresponding filtered signal. The corresponding filtered signal is compared to a reference threshold voltage to generate an output signal potentially indicative of arcing. A selection is made of one from a plurality of available threshold voltages as the reference threshold voltage for use in the comparing operation.

BRIEF DESCRIPTION OF THE DRAWINGS

In the drawings:

FIGS. 1a and 1b form a circuit schematic of an arc fault circuit interrupter system in accordance with the invention;

DETAILED DESCRIPTION OF THE ILLUSTRATED EMBODIMENT

Figure 1B:
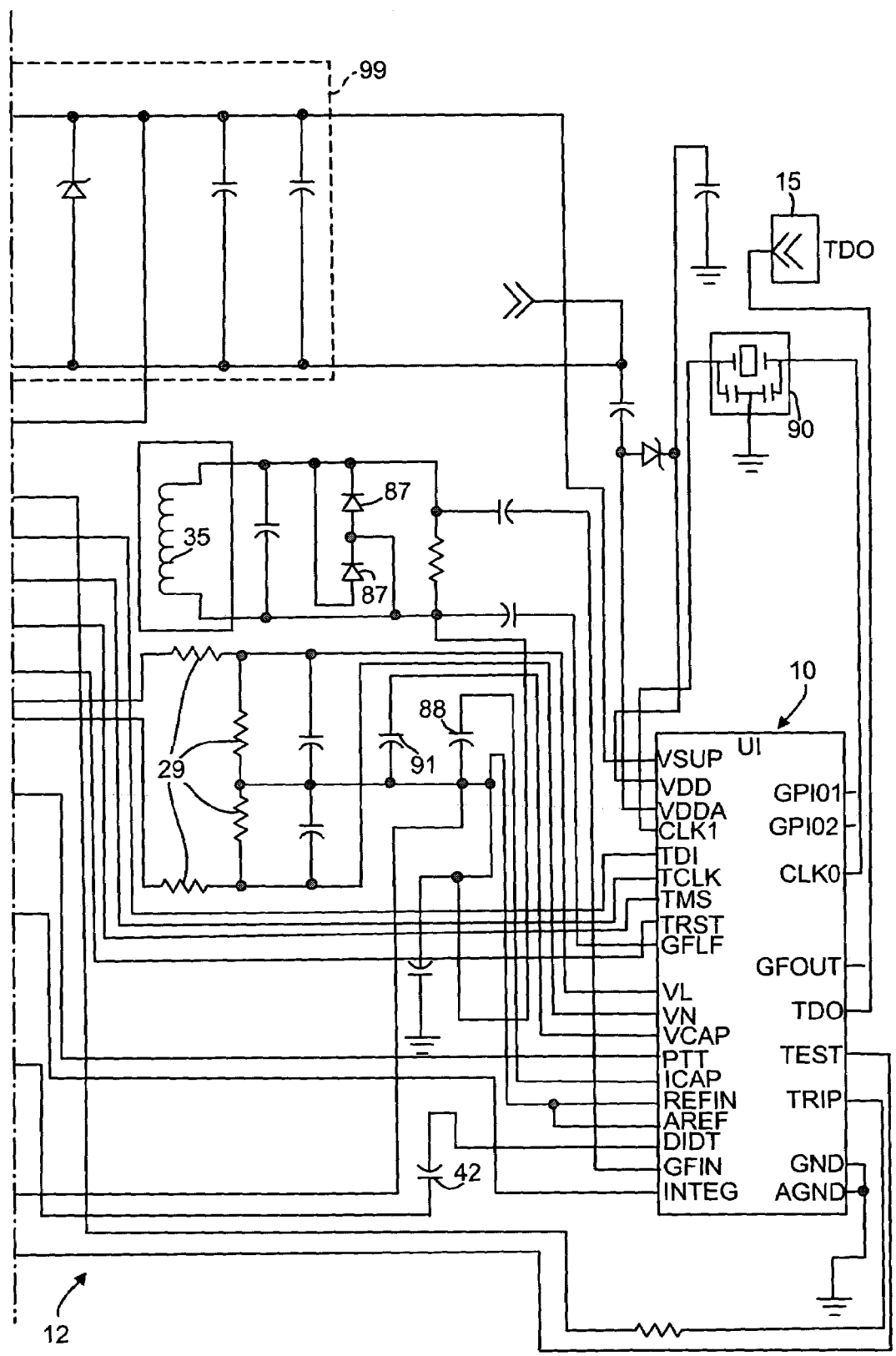
Figure 2:
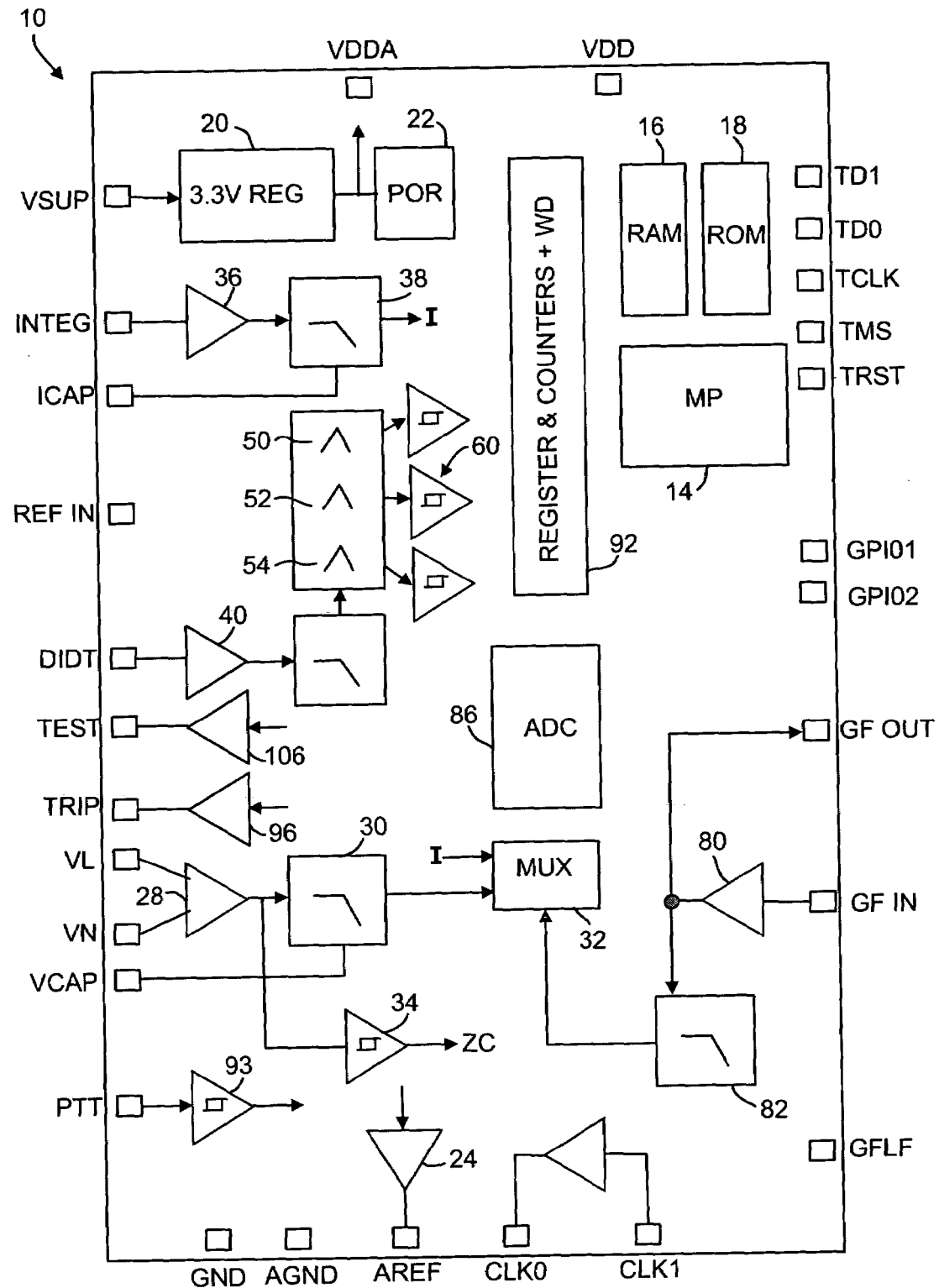
FIG. 2 is a functional diagram showing further details of an application specific integrated circuit chip which forms a part of a system of FIGS. 1a and 1b.

Reference is now made to FIGS. 1a and 1b which illustrates a circuit schematic of an arc fault circuit interrupter system in accordance with an embodiment of the invention. In a preferred, but not limiting, embodiment the circuit is representative of a system on chip solution for arc fault detection primarily for use in circuit breakers or electrical outlet receptacles, or other electrical devices, typically but not limited to the 15 or 20 ampere size. A microchip (i.e., an integrated circuit—IC) 10 is installed on an electronic printed wiring board 12 with a minimum of external components to provide a system which enables arc fault detection and tripping of the host wiring device. The system on chip microchip 10 can comprise an application specific integrated circuit (ASIC) which combines analog and digital signal processing on a single integrated circuit chip. A block diagram of the chip 10 is shown in FIG. 2.

The microchip 10 monitors line voltage and current in the host device and analyzes for the presence of an arc fault. If certain arc detection criteria are met as determined by an arcing algorithm embedded within the software of the memory (ROM) 18 of the chip 10, the chip signals an external SCR 98 (see, FIG. 1a) causing the trip coil 100 (described below) to disconnect the device from the load.

The ASIC generally includes a processor or microcontroller 14, memories (RAM 16 and ROM 18), amplifier stages, filters, A/D converter, analog multiplexer, a voltage regulator and power on reset circuit. The tasks of the ASIC are: measure line voltage, detect voltage zero crossings, measure 60 Hz line current, measure ground fault current, detect ground loops (grounded neutral) in the neutral line, detect high frequency components of line current, provide voltage regulation for all ASIC circuits, detect the presence of a signal to commence self test, generate a self test high frequency current source, provide undervoltage reset (POR) for the microcontroller, provide a trip signal to fire a trip solenoid driver, provide a watchdog to reset the microcontroller, and make a trip decision based on embedded code in the microcontroller.

The ASIC can operate in two different modes:

The "normal" mode corresponds to the mode where the processor 14 is the master. In normal mode, the microprocessor controls the data conversion rate (A-to-D), counters, interruptions and data memories. The microprocessor 14 executes code stored in a ROM memory 18. Moreover, the microprocessor 14 controls the activity of all analog blocks by forcing a "power down" signal in order to limit the power dissipation. This mode is the normal operation mode of the ASIC.

The "slave" mode corresponds to the mode where the processor 14 is the slave and is controlled by a standard communication channel (for example, a JTAG) interface or port 15 (see, FIGS. 1a and 1b). Two main operations can be done in this mode using the JTAG interface 15: debug mode, and register values and data transfer. The JTAG port can be used to couple a personal computer (PC) or other external processor to the ASIC, using the processor 14 of the ASIC as a slave processor. This permits interrogation of the ASIC counters, registers, etc. as well as rewriting to memories, registers, etc. of the ASIC. The JTAG ports 15 include data in/out ports (TDI, TDO), and reset (TRST), clock (TCLK) and mode select (TMS) ports.

The processor 14, in one embodiment, is the ARM7 TDMI from the ARM company. The ARM7 has a boundary scan circuit around its interface which is used for production test or for connection to an in-circuit emulator (ICE) interface (i.e., the JTAG) for system and software debugging. The JTAG interface is accessible via the pins TDI, TDO, TMS, TCLK and TRST and behaves as specified in the JTAG specification.

The processor is 32 bits wide and has a CPU frequency of 12 MHz. An external resonator 90 (FIG. 1b) has a frequency of 24 MHz which is divided by two for the CPU. The microprocessor analyzes the current, ground fault and di/dt signals and by means of an arc detection algorithm executed by the processor makes a trip decision, using the presence of broadband noise and the current peaks and rise time (di/dt). One such algorithm for making this detection is described in U.S. Pat. No. 6,259,996, issued Jul. 10, 2001, the disclosure of which is hereby incorporated by reference. While the line voltage is fed to the microprocessor, it may be optionally used by the algorithm to effect various levels of arc detection as dictated by the embedded software. The microprocessor uses the zero crossing signal to synchronize the arc detection algorithm with line voltage.

There are different clock domains in the ASIC: A clock for the ARM, the bus controller and the memories. The microprocessor clock frequency is 12 MHz. Clocks for the peripherals (counters, watchdog, ADC, BP filters) are 4 MHz, 1 MHz and 250 KHz frequencies. These clocks are fixed and derived from the ARM clocks.

There are two memory domains. The program memory, which contains the software for the ARM operation, contains a 14 kb ROM 18 (3584 words of 32 bits), and the program memory start address is 0000:0000hex. The data memory 16 contains the program data and consists of two RAMs 16 of 192 bytes×16 bits for a total of 768 bytes. The memory access can be 32 bits or 16 bits wide. The ARM selects the access mode. The data memory start address is 0004:0000hex. In addition to the memories, the processor can also access registers. The register memory start address is 0008:0000hex.

The various functional blocks (see, FIG. 2), and their respective operation, are described briefly below:

A 3.3V regulator 20 provides a finely regulated DC power source for use by the analog and digital sections of the chip. The input to the chip need only be roughly regulated to within coarse limits, for example, 4 to 7 volts.

The POR or power on reset circuit 22 senses the chip's regulated voltage supply and holds the microcontroller in a reset state if the voltage is below a safe operating limit.

The analog reference circuit (AREF) 24 provides a reference point for the input signals at the midpoint of the analog power supply to allow the amplified signals to swing both positive and negative. The AREF is externally connected to the REFIN pin.

A VL/VN differential amplifier 28 differentially measures line voltage at the terminals of the host device via an externally located voltage divider 29 (FIG. 1b). The voltage signal is low pass filtered as shown at the low pass filter block 30 to remove high frequency noise or harmonics and to provide anti-aliasing. The filtered signal is sent to a first channel of a multiplexer 32 and also to the input of a zero crossing detector 34. The output voltage at VCAP pin and an external capacitor 91 (FIG. 1b) provides an anti-aliasing low-pass filter (LPF) for the A/D converter 86. The typical differential input range at the inputs is +/−0.65V.

A comparator used for the zero-crossing detector 34 at the output of the line voltage differential amplifier 28 detects zero crossings (ZC) in the line voltage for use in synchronizing an arc detection algorithm.

An amplifier 36 at the INTEG input amplifies the externally integrated output of a di/dt sensor before it is lowpass filtered 38 for anti-aliasing and sent to a second channel (I) of the multiplexer 32 previously referenced.

The output of a di/dt sensor 25 (see FIG. 1) monitoring line current through the host device is connected to the input of a di/dt amplifier 40 after first being high pass filtered by filter capacitors 42 (FIG. 1b) to remove the 60 Hz component. The di/dt signal is amplified at amplifier 40 and sent to the input of three bandpass filters 50, 52, 54. Broadband noise in the 10 KHz to 100 KHz range appearing at the DIDT input is one indicator of the presence of arcing (both for branch feeder and series arc faults).

Figure 3:
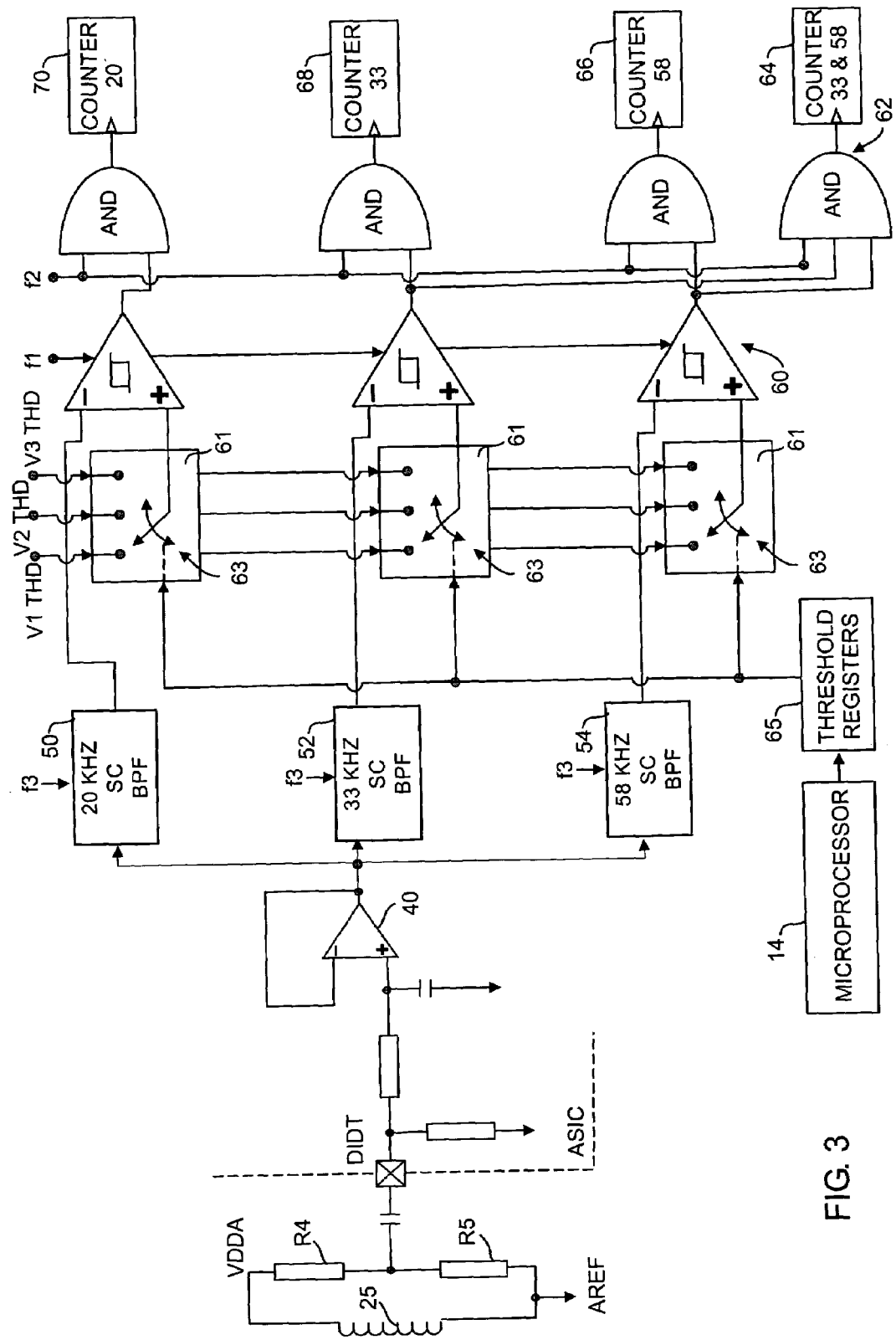
FIG. 3 is a functional block diagram illustrating operation of a digital circuit portion of the chip of FIG. 2.

FIG. 3 shows a more detailed block diagram of the di/dt sensing system which supports both branch feeder arc fault detection and series arc fault detection. Three switched cap (SC) bandpass filters (BPF) 50, 52 and 54, with center frequencies set respectively at 20, 33 and 58 KHz, filter the di/dt signal to determine if there is broadband noise in the line current. The 20 KHz BP filter has a typical quality factor Q of 4. Both of the 33 and 58 KHz BP filters have typical Q of 8. The output of the filters is monitored by a set of comparators 60 whose outputs change state when a predetermined selectable threshold voltage is exceeded by the voltage of the corresponding filter output signal. Adjustment of the threshold voltages allows for tuning of the device to detect either, or both, branch feeder arc fault detection and series arc fault detection. The microprocessor 14 (FIG. 2) monitors counters 64, 66, 68 and 70 to determine the presence of broadband noise indicative of one or the other or both of branch feeder arc faults and series arc faults. In a preferred implementation, the outputs of the comparators 60 and the outputs of the AND gates 62 are synchronized by the same clock ($f_1$ and $f_2$=1 MHz, for example) as the switched capacitor bandpass filters 50, 52 and 54 ($f_3$=1 MHz, for example).

In the exemplary implementation illustrated in FIG. 3, it should be noted that the ANDing of the 33 kHz and 58 kHz comparator outputs with each other and the clock ensures that the components of high frequency in the passbands of both the 33 KHz and 58 KHz filters must be simultaneously present and of sufficient amplitude (depending on branch feeder arc fault detection and/or series arc fault detection) in order to be considered broadband noise and therefore be counted by the 33/58 counter 64. It will be understood that any combination of two or more comparator outputs may be logically ANDed together (with the synchronization signal, if desired).

Separate counters 66, 68 and 70, are provided for individually counting the components in the passbands of the 20 KHz, 33 KHz and 58 KHz BPF's, respectively, so as to determine whether components of high frequency in individual ones of the passbands are of sufficient amplitude (depending on branch feeder arc fault detection and/or series arc fault detection) in order to be considered noise indicative of an arc fault event.

The ASIC provides an amplification of the di/dt input signal and performs analog signal processing. As described above, the signal going through the three independent switched-cap bandpass filters 50, 52 and 54 (at different frequencies of 20, 33 and 58 KHz) is compared by comparators 60 to a selectable threshold reference voltage. This comparison may be made in either or both directions (positive and negative). In a referred implementation, three threshold voltages are provided ($V1_{THD}$, $V2_{THD}$, and $V3_{THD}$), although it will be understood that any plural number of voltages may be supplied and selectively chosen for use. A voltage selector circuit 61, operable under the control of the microprocessor 14, is provided for each of the comparators 60. Each selector circuit 61 receives the three threshold voltages and includes a switching circuit 63 which chooses one of the received threshold voltages for output as the comparison voltage to the corresponding comparator 60. A threshold register circuit 65 is loaded by the microprocessor 14 with voltage selection data. In response to the voltage selection data stored in the register circuit 65, each of the selector circuits 61 functions to choose a designated one of the three threshold voltages ($V1_{THD}$, $V2_{THD}$, and $V3_{THD}$) for application to the corresponding comparator 60.

As discussed above, the outputs of the comparators control separate counters 66, 68 and 70. The ANDed boolean combination of the 33 and 58 KHz BP comparator outputs controls a fourth counter 64. All comparator outputs are synchronized on the switched-cap clock (1 MHz) and are stable during each period of 1 µs. The counters can be reset or disabled by software. An anti-aliasing filter is placed in the first stage. The cut-off frequency is typically 150 KHz. The sampling clock frequency of bandpass filters is $F_{1MHz}$. Clamping anti-parallel diodes are placed between AREF and DIDT pins internal to the ASIC.

The Z-domain function of the switched-cap bandpass filters can be described by the following expression:

$$Y_i = a(X_i - X_{i-1}) - bY_{i-1} - cY_{i-2}$$

where $X_i$ and $Y_i$ are, respectively, the $i^{th}$ samples of input and output voltages and a, b and c are the filter coefficients. The following Table provides exemplary coefficients for the bandpass filters.

| Coefficient of normalized BP | 20 KHz | 33 KHz | 58 KHz |
|---|---|---|---|
| a | 0.031 | 0.026 | 0.047 |
| b | −1.953 | −1.932 | −1.825 |
| c | 0.969 | 0.974 | 0.952 |

The output of a ground fault sensing transformer 35 (FIG. 1b) is connected to the input of a GFIN amplifier 80 (FIG. 2), which has a high gain to amplify the small output from the sensor. The ground fault signal is amplified and lowpass filtered (82) (FIG. 2) for anti-aliasing before being fed to the third channel of the multiplexer 32 (FIG. 2).

Figure 4:
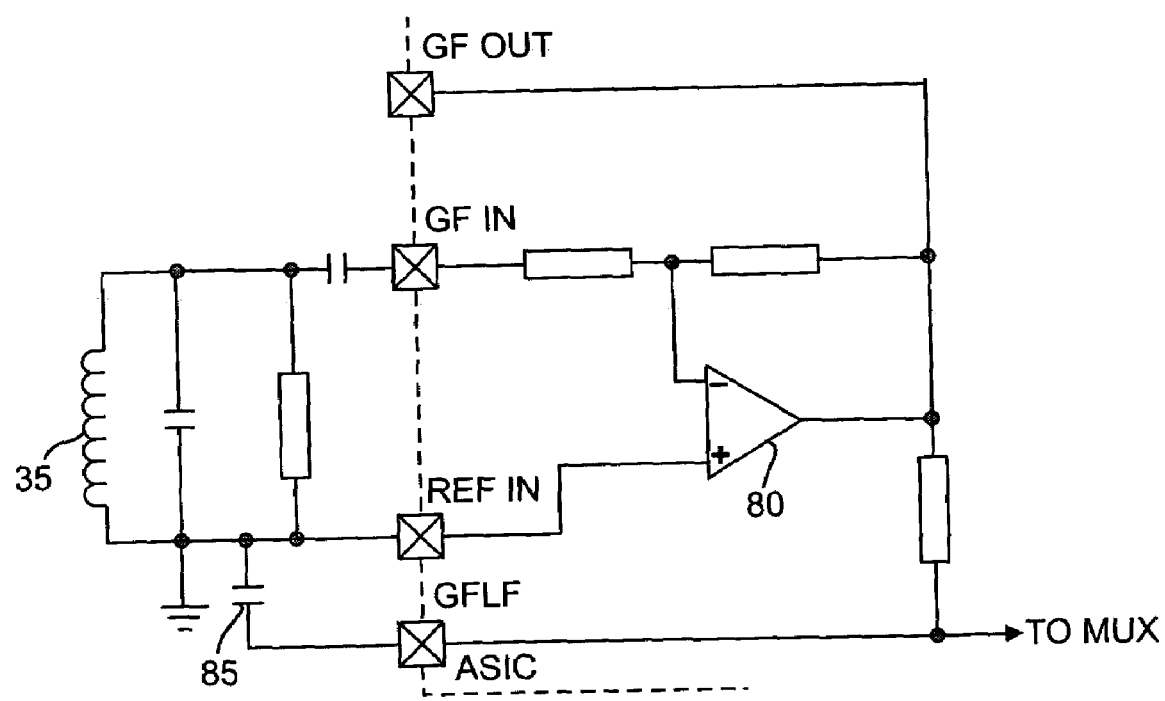
FIG. 4 is a circuit schematic of a signal processing circuit which forms a part of the chip of FIG. 2.

Referring now to FIG. 4, there is shown a circuit that performs an amplification and anti-aliasing low pass (LP) filtering of the ground fault (GF) input voltage before A-to-D conversion. Clamping anti-parallel diodes 87 (see FIG. 1b) are placed between AREF and GFIN pins for transient protection.

The multiplexer 32 (FIG. 2) alternately selects between the three channel inputs, i.e., current, line voltage or ground fault and passes the selected signal to the input of an analog to digital (A/D) converter (ADC) 86 (FIG. 2). The analog to digital converter 86 is a single channel sigma delta converter which alternately digitizes the current, line voltage and ground fault signals for analysis by the microprocessor.

The line current signal at ASIC pin INTEG is obtained by an external low-pass filter 84 placed in the output of the di/dt coil 25 (FIG. 1a). The ASIC amplifies the INTEG signal. An anti-aliasing LP filter is obtained by an external capacitor 88 (FIG. 1b) placed at ICAP pin before A-to-D conversion stage.

The watchdog (WD) 92 monitors the operation of the ARM microprocessor 14. If the software does not reset the watchdog counter at periodic times, the watchdog generates a hard reset of the microprocessor. Alternately, it could be used to cause a trip condition. The watchdog is based on a 13 bit wide periodic counter which is driven by the 250 KHz clock. The counter is reset by software with the WDG_RST address. Writing a 1 on this address resets the counter. As noted, the watchdog must be reset only in a specific time window, otherwise a hard reset is generated. If the watchdog is reset before the counter reaches $2^{12}$ or if the counter is not reset before the counter reaches $2^{13}$, the watchdog reset is generated for the ARM and for the WD counter.

To allow the ARM to check the watchdog value, the MSB (bit 12) can be read and if the value is 1, the processor must reset the counter.

When the watchdog generates a reset, a specific register is set to indicate that a watchdog reset has occurred. This register value can be read even after the reset.

When a trip decision is reached, a trip signal buffer 96 latches and drives the gate of an SCR 98 of an external firing circuit (FIG. 1a). In order to conserve stored energy during the trip sequence, the microprocessor is halted and portions of the analog circuitry are disabled. The SCR 98 is connected in series with a trip coil (solenoid) 100. In the ON state, the SCR 98 causes the coil 100 to be momentarily shorted across the line to mechanically de-latch the contacts of the host device and to subsequently interrupt flow of current (see, for example, U.S. Pat. No. 5,682,101, the disclosure of which is hereby incorporated by reference. A varistor V1 is connected across the AC terminals of a diode bridge CR1. The varistor V1 functions as a transient suppressor. The DC terminals of the diode bridge CR1 are connected across the terminals of the SCR 98. The voltage level of the SCR 98 is set by voltage reference circuit 99 which also generates supply voltages for the ASIC chip 10. The trip signal generated at the TRIP pin of the ASIC chip 10 functions to supply current to the gate of the SCR, which charges capacitor C1 connected between the SCR control terminal and ground. When the SCR is turned on, the diode bridge CR1 is shorted by the SCR, which causes current to flow through trip coil 100. A resistor R1 is connected in parallel with the capacitor C1.

A circuit 101 is also included and connected around the diode bridge CR1. A first series capacitive/resistive branch 103 is connected to one varistor V1 terminal on the AC side of the diode bridge CR1, while a second series capacitive/resistive branch 105 is connected to the other varistor V1 terminal also on the AC side of the diode bridge CR1. These first and second branches 103/105 are connected to a first pair of terminals of a second diode bridge CR2. One of the other pair of terminals of the second diode bridge CR2 is connected on the DC side of the first diode bridge CR1, while a second of those terminals is connected into the voltage reference circuit 99.

The push to test (PTT) circuit 102 monitors the status of a push to test (PTT) button 104. When the push to test button is depressed, line voltage is applied through an external voltage divider in circuit 102 to the PTT input of the chip 10. The circuit senses that a system test is being requested and signals the microprocessor to enter a test mode. The activation of the test button 104 (not part of the ASIC) is detected by the PTT comparator 93 (FIG. 2) as a voltage at a PTT (Push-to-Test) pin.

With the microprocessor in the test mode, test signal buffer 106 acts as a current source driving a test winding 45 (FIG. 1a) of the di/dt sensor with a sharply rising and falling edge square wave at each of the center frequencies of the bandpass filters, namely 20 KHz, 33 KHz and 58 KHz in turn. A pair of protective, anti-parallel, diodes D1 and D2 snub out transients.

Figure 5:
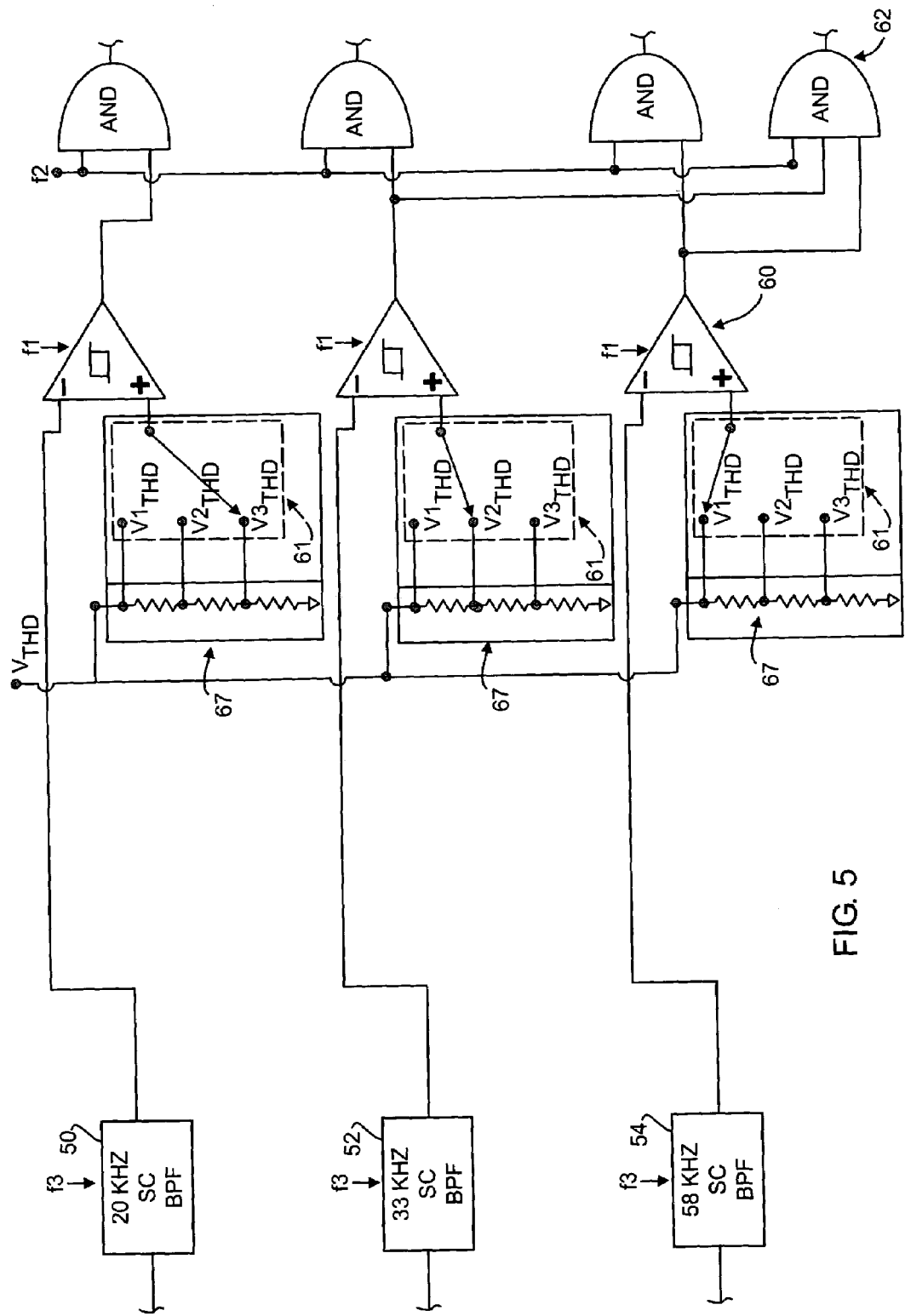
FIG. 5 is a circuit schematic of an alternative embodiment of the circuit illustrated in FIG. 3.

Reference is now made to FIG. 5 wherein there is shown a schematic diagram of an alternative circuit implementation to that shown in FIG. 3. In the FIG. 5 circuit, a single reference threshold voltage $V_{THD}$ is supplied. Associated with each selector circuit 61 is a resistive voltage divider 67 that is tapped to provide the plurality of threshold voltages (for example, $V1_{THD}$, $V2_{THD}$, and $V3_{THD}$, as discussed above) for selective application to the corresponding comparator 60.

The following list briefly describes each pin of the ASIC 10.

| Name | Type | Description |
| --- | --- | --- |
| VSUP | Power | High positive ASIC supply voltage |
| VDDA | Power | Analog positive ASIC supply voltage and regulator output |
| VDD | Power | Digital positive ASIC supply voltage (input) |
| AGND | Power | Analog ground |
| GND | Power | Digital ground |
| INTEG | Analog | Input for Current measurement |
| ICAP | Analog | Input for LP filter |
| REFIN | Analog | Input sense of reference voltage |
| AREF | Analog | Analog reference output |
| DIDT | Analog | Input for DIDT measurement |
| TEST | Analog | Test output signal |
| TRIP | Analog | Trip output signal |
| VL | Analog | Input for voltage measurement |
| VN | Analog | Input for voltage measurement |
| VCAP | Analog | Input for LP filter |
| PTT | Analog | PTT Input signal |
| CLKI | Analog | Input clock of quartz |
| CLKO | Analog | Output clock of quartz |
| GFIN | Analog | Input signal for GF measurement |
| GFOUT | Analog | Output of gain stage |
| GFLF | Analog | Input for LP filter |
| GPIO1 | Digital | Bi-directional |
| GPIO2 | Digital | Bi-directional |
| TDI | Digital - in | Data in |
| TDO | Digital-out | Data out |
| TCLK | Digital - in | Clock in |
| TMS | Digital - in | Select in |
| TRST | Digital - in | Reset in (active low) |

Additional Operational Description

With reference once again to FIG. 3, the inductor 25 functions as a di/dt sensor to monitor line current passing through the arc fault circuit interrupting device. The output of the sensor is connected to the ASIC by means of a voltage divider formed by resistors R4 and R5 (having a exemplary ratio of 1/4). The full output of the sensor is also connected to an RC integrator 36 (through the INTEG pin as shown in FIGS. 1b and 2) to produce a signal representative of the 60 Hz fundamental load current and low harmonics thereof.

The voltage divider output connects to the ASIC through a capacitor (DC blocking) at the DIDT pin (see, FIG. 1b). Once inside the ASIC, the signal is applied to a low pass filter circuit with a cut-off frequency typically at about 150 kHz. It is noted here that the frequency band of interest with respect to arc fault detection by measuring high frequency spectral components in the load current signature of an arcing load is typically in the 10 kHz to 100 kHz band. Electrical noise in this frequency range provides an indication of arcing. A unity gain amplifier 40 on the ASIC buffers the input signal from the subsequent inputs of the switched capacitor band-pass filters 50, 52 and 54. In an exemplary preferred implementation, these filters have center frequencies set at 20 KHz, 33 kHz and 58 kHz, with center frequency gains of approximately 8. It will be understood, however, that different center frequencies and gains can be selected for the ASIC filters depending on application needs. In the event simultaneous output signals are generated from any two of the three filters, provided those output signals exceed a predetermined threshold (chosen from a plurality of available thresholds by circuit 61), this would be indicative of broadband noise in the frequency band of interest (which is one element used by the microprocessor of the ASIC in determining an instance of arcing).

The output of each band-pass filter 50, 52 and 54 is connected to one of the comparators 60. Each comparator 60 functions to determine if the spectral components measured by the corresponding band-pass filter have exceeded a specified voltage threshold (for example, $V1_{THD}$, $V2_{THD}$, or $V3_{THD}$). In the exemplary implementation, the specified voltage threshold is selected by circuit 61 from any of the three provided levels. For reference, in an exemplary implementation, the threshold voltages may comprise: $V1_{THD}$=0.33 V, $V2_{THD}$,=0.19 V and $V3_{THD}$=0.11 V. By employing switching circuitry in the circuit 61 (not explicitly shown), the reference voltages may be reversed to sense negative as well as positive going signals as output from the band-pass filters 50, 52 and 54.

The selector circuit 61 operates under program control of the microprocessor 14 to make the selection of which one of the plural available reference threshold voltages is to be applied to the corresponding comparator 60. The microprocessor 14 may comprise an ARM7 TDMI as provided by the ARM company. In the preferred implementation, the ARM7 is incorporated into the ASIC design. The microprocessor executes its program instructions to choose a certain one of the plural threshold voltages for each included comparator 60. The voltage choices are loaded by the microprocessor 14 into the threshold register circuit 65. Decoding circuitry (not explicitly shown) then sets the reference voltage for each comparator 60 based on the loaded register values by selectively controlling the operation of the switching circuit 63 to select one of the received threshold voltages for output as the comparison voltage to the corresponding comparator 60.

The reference voltage for two or more of the comparators 60 may be selected by the microprocessor 14 through the register circuit 65 to be the same voltage. Alternatively, the voltage for each comparator 60 may be selected to be different. It is noted that different loads on the circuit being monitored may produce different amounts of high frequency noise at different current levels. The ability of the microprocessor 14 to selectively choose threshold voltage levels allows for adjustments in detection level to be made with respect to each of the band-pass filters 50, 52 and 54, and thus account for the differences in high frequency noise and provide for improved broadband noise detection. For example, changing the threshold voltage levels at different frequencies under microprocessor control allows the circuit to operate in detecting either or both a branch feeder arc fault and a series arc fault.

The outputs of the comparators 60 and the AND gates 62 are synchronized by the clock of the switched capacitor filters 50, 52 and 54 (for example, a 1 MHz clock can be used for each device). The logical operation of ANDing plural comparator outputs with the clock signal ensures that the components of selected threshold exceeding high frequency noise in the passbands of the included comparators are present simultaneously (thus indicating that the noise has a broadband characteristic). As an example illustrated in FIG. 3, AND gate 62 logically combines both the 33 kHz filter 52 and the 58 kHz filter 54 output with the clock signal. When all inputs to the AND gate 62 are a logic high, the output is logic high and indicates simultaneous noise at both 33 kHz and 58 kHz bands which can be considered to have a broadband characteristic thus signaling a possible arcing event. It will be understood that other frequency combinations can also be considered by the AND gates 62 (such as, for example, logically ANDing the outputs of all three illustrated comparator outputs to detect an even greater instance of broadband noise. It will further be noted that the AND gates 62 can further be provided, as shown, to make detections with respect to individual ones of the frequency passbands of the filters 50, 52 and 54.

The output of each included AND gate 62 is presented to a corresponding counter 64, 66, 68 and 70. Responsive to a logic high signal output from an AND gate 62, the corresponding counter 64, 66, 68 and 70 increments. The values of the counters are read by the microprocessor 14 in accordance with its program instructions, and the values processed to make determinations, perhaps in conjunction with other data, as to whether an arcing event has occurred. For example, if a sufficient number of counts are detected within a certain period of time, arcing may be present. The changing of the threshold reference voltage levels by the microprocessor allows the device to detect one or the other or both of a branch feeder arc fault and a series arc fault. Reference is made to U.S. Pat. No. 6,259,996, the disclosure of which is hereby incorporated by reference, for other waveform characteristics that can be taken into consideration by the microprocessor 14 in making an arcing event determination.

The ground fault detection feature operates to detect arcing to ground, in the incipient stages of arcing, where a grounding conductor is in the proximity of the faulty line conductor. Such detection and tripping can clear arc faults before they develop into major events. As discussed earlier, by the use of appropriate ground fault and neutral sensing transformers, this feature can be used to provide personnel protection as well as arc to ground detection.

With reference once again to FIGS. 1a and 1b, when the push to test button 104 is depressed, line voltage is applied to push to test circuit 102 in such a way as to cause ground fault current to flow through the ground fault sensing transformer 83 (FIG. 4) and simultaneously force the microcontroller 14 into the test mode. The microprocessor monitors the output of both the ground fault detection circuitry and the output of the band-pass filters (caused by the test buffer driving the test winding) to determine if the bandpass filter detection circuitry is functional. Only if counters 66 and 68 have sufficiently high counts and sufficiently high ground fault signal peaks are present, will a trip signal be given.

A calibration routine allows the microprocessor 14 to compensate for the offset voltages generated by each of the operational amplifiers in the line voltage, current and ground fault measurement circuits. Immediately following power up and at periodic intervals (to update the data, e.g., to compensate for thermal drift), the microprocessor initiates a calibration procedure. During this time period, the line voltage and current measurement circuits are internally disconnected from their respective input terminals and each of the operational amplifiers is connected in turn to analog reference voltage (AREF) 24. The respective offset voltages (one for each op amp) are then read by the microprocessor and their values are stored in memory. The stored offset voltages are subtracted from the measured signal values by the software. The ground fault offset is measured by internally shorting the first stage amplifier (80) gain setting resistors and reading the offset voltage on an external AC coupling capacitor directly from the input. The software subtracts this value from the measured signal value.

Residential type circuit breakers incorporating arc fault circuit protection require a very small printed wiring board with low power dissipation. Arc fault circuit interruption requires significant analog and digital signal processing in order to reliably distinguish between arc faults and electrically noisy loads, such as arcs from light switches and universal motors. In a previous embodiment, such processing was achieved using a separate analog ASIC (application specific integrated circuit) and a microcontroller.

The system on chip design provides a reduced package size, approximately ⅓ reduction, as well as a reduction in external components required. The combination of reduced parts and part placement results in a significant cost reduction and ease of assembly. Bandpass filter performance is more consistent, offset voltage correction is improved, test circuit performance is improved, and ground fault personnel protection can be provided.

While particular embodiments and applications of the present invention have been illustrated and described, it is to be understood that the invention is not limited to the precise construction and compositions disclosed herein and that various modifications, changes, and variations may be apparent from the foregoing descriptions without departing from the spirit and scope of the invention as defined in the appended claims.

What is claimed is:

1. A circuit for determining whether arcing is present in an electrical circuit in response to a sensor signal corresponding to current in said electrical circuit, comprising:
   a filter circuit for analyzing said sensor signal to determine the presence of noise in a predetermined frequency range, and producing a corresponding filtered signal, wherein said filter circuit includes at least two bandpass filters having different passbands;
   a comparator circuit for comparing the corresponding filtered signal to a reference threshold voltage to generate an output signal, wherein said comparator circuit includes a corresponding at least two comparators, each receiving a reference threshold voltage, and each operable to compare the corresponding filtered signal to a reference threshold voltage to generate an output signal; and
   a switching circuit for each of the comparators, each switching circuit receiving a plurality of threshold voltages and operating to select one of those threshold voltages as the reference threshold voltage for application to its corresponding comparator circuit.

2. The circuit of claim 1 further including a controller circuit for processing said sensor signal and said output signal to determine whether an arcing fault is present in said electrical circuit.

3. The circuit of claim 2 wherein said filter circuit for analyzing and said controller are integrated onto a single application specific integrated circuit chip (ASIC).

4. The circuit of claim 1 further including a counter operable to increment in response to said output signal.

5. The circuit of claim 4 further including a controller circuit for periodically determining whether an arcing fault is present by monitoring said counter and comparing a count in said counter with one or more preselected counts indicative of an arcing fault.

6. The circuit of claim 5 wherein said filter circuit for analyzing and said controller are integrated onto a single application specific integrated circuit chip (ASIC).

7. The circuit of claim 4 wherein said counter is implemented in software.

8. The circuit of claim 1 wherein the reference threshold voltages for each of the comparators are selected by the selection circuit to be different.

9. The circuit of claim 1 further including at least one counter for each comparator wherein each counter is operable to increment in response to said output signal for its comparator.

10. The circuit of claim 1 further including at least one counter operable to increment in response to simultaneous output signals generated from at least two comparators.

11. The circuit of claim 1 further including a controller circuit for processing said sensor signal and said output signals to determine whether an arcing fault is present in said electrical circuit.

12. The circuit of claim 11 wherein said filter circuit for analyzing and said controller are integrated onto a single application specific integrated circuit chip (ASIC).

13. The circuit of claim 1 further including a controller circuit for selectively controlling the switching circuit to select one of the plurality of threshold voltages as the reference threshold voltage for application to the comparator circuit.

14. A circuit for determining whether arcing is present in an electrical circuit in response to a sensor signal corresponding to current in said electrical circuit, comprising:
   a filter circuit for analyzing said sensor signal to determine the presence of noise in a predetermined frequency range, and producing a corresponding filtered signal;
   a comparator circuit for comparing the corresponding filtered signal to a reference threshold voltage to generate an output signal;
   a switching circuit receiving a plurality of threshold voltages and operating to select one of those threshold voltages as the reference threshold voltage for application to the comparator circuit; and
   a controller circuit for selectively controlling the switching circuit to select one of the plurality of threshold voltages as the reference threshold voltage for application to the comparator circuit;
   wherein the controller circuit comprises threshold register and a microprocessor, and wherein the microprocessor loads the threshold register with a value indicative of the selected one of the plurality of threshold voltages, and the switching circuit responds to the value loaded into the threshold register to make the selection.

15. A circuit for determining whether arcing is present in an electrical circuit in response to a sensor signal corresponding to current in said electrical circuit, comprising:
   a filter circuit for analyzing said sensor signal to determine the presence of noise in a predetermined frequency range, and producing a corresponding filtered signal;
   a comparator circuit for comparing the corresponding filtered signal to a reference threshold voltage to generate an output signal;
   a switching circuit receiving a plurality of threshold voltages and operating to select one of those threshold voltages as the reference threshold voltage for application to the comparator circuit; and
   a controller circuit for selectively controlling the switching circuit to select one of the plurality of threshold voltages as the reference threshold voltage for application to the comparator circuit;

wherein the plurality of threshold voltages include a voltage useful in detecting branch feeder arc faults in the electrical circuit and another voltage useful in detecting series arc faults in the electrical circuit.

16. A circuit for determining whether arcing is present in an electrical circuit in response to a sensor signal corresponding to current in said electrical circuit, comprising:
 a filter circuit for analyzing said sensor signal to determine the presence of noise in a predetermined frequency range, and producing a corresponding filtered signal;
 a comparator circuit for comparing the corresponding filtered signal to a reference threshold voltage to generate an output signal;
 a switching circuit receiving a plurality of threshold voltages and operating to select one of those threshold voltages as the reference threshold voltage for application to the comparator circuit; and
 a controller circuit for processing said output signal to determine whether an arcing fault of the series type is present in said electrical circuit.

17. A circuit for determining whether arcing is present in an electrical circuit in response to a sensor signal corresponding to current in said electrical circuit, comprising:
 a filter circuit for analyzing said sensor signal to determine the presence of noise in a predetermined frequency range, and producing a corresponding filtered signal;
 a comparator circuit for comparing the corresponding filtered signal to a reference threshold voltage to generate an output signal; and
 a switching circuit receiving a plurality of threshold voltages and operating to select one of those threshold voltages as the reference threshold voltage for application to the comparator circuit;
 wherein the plurality of threshold voltages include a voltage useful in detecting branch feeder arc faults in the electrical circuit and another voltage useful in detecting series arc faults in the electrical circuit.

18. The circuit of claim 17 wherein said filter circuit includes at least two bandpass filters having different passbands, and wherein said comparator circuit includes a corresponding at least two comparators, each receiving a reference threshold voltage, and each operable to compare the corresponding filtered signal to a reference threshold voltage to generate an output signal.

19. The circuit of claim 18 further comprising a switching circuit for each of the comparators, each switching circuit receiving the plurality of threshold voltages and operating to select one of those threshold voltages as the reference threshold voltage for application to its corresponding comparator.

20. The circuit of claim 17 wherein the plurality of threshold voltages are generated by a voltage divider circuit from a common reference voltage.

21. A method for determining whether arcing is present in an electrical circuit in response to a sensor signal corresponding to current in said electrical circuit, comprising:
 filtering said sensor signal to determine the presence of noise in a predetermined frequency range so as to produce a corresponding filtered signal, wherein filtering comprises bandpass filtering in at least two different passbands;
 comparing the corresponding filtered signal to a reference threshold voltage to generate an output signal potentially indicative of arcing, wherein comparing comprises separately first and second comparing of the corresponding filtered signals in the different passbands to at least one reference threshold voltage; and
 selecting individually for each of the separate first and second comparing one from a plurality of available threshold voltages as the reference threshold voltage for use in comparing.

22. The method of claim 21 further including processing said sensor signal and said output signal to determine whether an arcing fault is present in said electrical circuit.

23. The method of claim 21 further including counting a number of instances of said output signal.

24. The method of claim 23 further including periodically determining whether an arcing fault is present by monitoring said counted number of instances and comparing the counter number with one or more preselected counts indicative of an arcing fault.

25. The method of claim 21 wherein the reference threshold voltages for each separate first and second comparing are selected to be different.

26. The method of claim 21 further including counting, separately for each of the separate first and second comparing a number of instances of the output signals.

27. The method of claim 21 further including counting a number of instances of simultaneous output signals generated from the separate first and second comparing.

28. The method of claim 21 further including processing said sensor signal and said output signals to determine whether an arcing fault is present in said electrical circuit.

29. A method for determining whether arcing is present in an electrical circuit in response to a sensor signal corresponding to current in said electrical circuit, comprising:
 filtering said sensor signal to determine the presence of noise in a predetermined frequency range so as to produce a corresponding filtered signal;
 comparing the corresponding filtered signal to a reference threshold voltage to generate an output signal potentially indicative of arcing;
 selecting one from a plurality of available threshold voltages as the reference threshold voltage for use in comparing; and
 selectively choosing one of the plurality of threshold voltages as the reference threshold voltage for comparing;
 wherein the plurality of threshold voltages include a voltage useful in detecting branch feeder arc faults in the electrical circuit and another voltage useful in detecting series arc faults in the electrical circuit.

30. A method for determining whether arcing is present in an electrical circuit in response to a sensor signal corresponding to current in said electrical circuit, comprising:
 filtering said sensor signal to determine the presence of noise in a predetermined frequency range so as to produce a corresponding filtered signal;
 comparing the corresponding filtered signal to a reference threshold voltage to generate an output signal potentially indicative of arcing;
 selecting one from a plurality of available threshold voltages as the reference threshold voltage for use in comparing; and
 processing said output signal to determine whether an arcing fault of the series type is present in said electrical circuit.

31. A method for determining whether arcing is present in an electrical circuit in response to a sensor signal corresponding to current in said electrical circuit, comprising:
    filtering said sensor signal to determine the presence of noise in a predetermined frequency range so as to produce a corresponding filtered signal;
    comparing the corresponding filtered signal to a reference threshold voltage to generate an output signal potentially indicative of arcing; and
    selecting one from a plurality of available threshold voltages as the reference threshold voltage for use in comparing;
    wherein the plurality of threshold voltages include a voltage useful in detecting branch feeder arc faults in the electrical circuit and another voltage useful in detecting series arc faults in the electrical circuit.

32. The method of claim 31 wherein filtering comprises bandpass filtering in at least two different passbands, and wherein comparing comprises separately first and second comparing of the corresponding filtered signals in the different passbands to at least one reference threshold voltage.

33. The method of claim 32 further comprising selecting individually for each of the separate first and second comparing one of those threshold voltages as the reference threshold voltage.

34. The method of claim 31 further comprising generating the plurality of threshold voltages from a common reference voltage using a voltage division operation.

* * * * *